US011075494B2

(12) United States Patent
Matsuura

(10) Patent No.: US 11,075,494 B2
(45) Date of Patent: Jul. 27, 2021

(54) CONNECTOR CONNECTION REGENERATING SYSTEM AND CONNECTOR CONNECTION REGENERATING METHOD

(71) Applicant: Yazaki Corporation, Tokyo (JP)

(72) Inventor: Shinya Matsuura, Makinohara (JP)

(73) Assignee: YAZAKI CORPORATION, Tokyo (JP)

( * ) Notice: Subject to any disclaimer, the term of this patent is extended or adjusted under 35 U.S.C. 154(b) by 68 days.

(21) Appl. No.: 16/676,066

(22) Filed: Nov. 6, 2019

(65) Prior Publication Data

US 2020/0185871 A1 Jun. 11, 2020

(30) Foreign Application Priority Data

Dec. 11, 2018 (JP) .............................. JP2018-231402

(51) Int. Cl.
*H02H 7/00* (2006.01)
*H01R 43/00* (2006.01)
*H02H 7/20* (2006.01)

(52) U.S. Cl.
CPC ............... *H01R 43/00* (2013.01); *H02H 7/20* (2013.01)

(58) Field of Classification Search
None
See application file for complete search history.

(56) References Cited

U.S. PATENT DOCUMENTS

| 4,443,049 A * | 4/1984 | De Pommery ...... G06K 7/0017 439/373 |
| 4,977,935 A * | 12/1990 | Durkee, Jr. ............ B67D 7/344 137/597 |
| 6,261,107 B1 * | 7/2001 | Takase ................... H01R 12/57 439/636 |
| 2009/0055052 A1 * | 2/2009 | You ..................... B60R 21/0173 701/45 |

FOREIGN PATENT DOCUMENTS

| JP | 3-57881 U | 6/1991 |
| JP | 2005-354767 A | 12/2005 |
| JP | 2012-227001 A | 11/2012 |

* cited by examiner

*Primary Examiner* — Stephen W Jackson
(74) *Attorney, Agent, or Firm* — Sughrue Mion, PLLC

(57) ABSTRACT

The objective is to provide a connector connection regenerating system and a connector connection regenerating method which enable failures regarding connector connections to be solved with reduced costs when the failures have occurred. The objective is solved by a connector connection regenerating system comprising a regeneration circuit, a first connecting circuit connecting a first signal terminal (first terminal) switchably to a signal circuit and to the regeneration circuit, a ground circuit for conducting a regeneration current to a predetermined ground, a second connecting circuit connecting a second signal terminal (second terminal) switchably to a downstream circuit and to the ground circuit, and a controller configured to cause switching the first signal terminal (first terminal) to the regeneration circuit and switching the second signal terminal (second terminal) to the ground circuit.

5 Claims, 7 Drawing Sheets

CONNECTOR CONNECTION REGENERATING SYSTEM AND CONNECTOR CONNECTION REGENERATING METHOD

BACKGROUND OF THE INVENTION

Technical Field

The present invention relates to a connector connection regenerating system and connector connection regenerating method for recovering a connected status between a first terminal of a first connector and a second terminal of a second connector.

Background Art

Conventionally, a connector connection has been used e.g. for connecting a wire harness to an equipment etc. Here, the following method has been proposed as a countermeasure in case of some failure at the side of the wire harness. That is, it has been proposed for a type of wire harness which is mounted to an electronic device that the electronic device is attachable to and removable from a harness main body, wherein the electronic device is removed from the harness main body for exchange or repair when a failure has occurred at the electronic device (see e.g. Patent Document 1). With this method, it is not necessary to exchange the entire wire harness when a failure has occurred at the electronic device, which can reduce the costs for failure occurrence.

CITATION LIST

Patent Literature

Patent Document 1: JP 2005-354767 A

SUMMARY OF THE INVENTION

In addition to failures which occur at the side of a wire harness as described above, failures which occur at a design with a connector connection include poor connections which are caused by increase of a connection resistance between connector terminals unallowably e.g. due to a foreign material between the terminals, such as oxide coating. Currently in many cases, the connector is to be removed and exchanged together with the wire harness having the connector mounted on its end as a countermeasure in case of such failures regarding the connector connection. Such a countermeasure is undesirable since the costs for failure tends to increase.

In the above description, the problem that costs for failure tends to increase was discussed with reference to the connector connection used e.g. for connecting a wire harness to an equipment as an example. However, such a problem is not limited to a design using a connector connection e.g. for connecting a wire harness to an equipment, but can generally exist at any design with a connector connection.

Accordingly, the present invention focuses on the problem as described above and is aimed at providing a connector connection regenerating system and a connector connection regenerating method which enable failures regarding connector connections to be solved with reduced costs when the failures have occurred.

In order to achieve the above mentioned objective, a connector connection regenerating system according to the present invention is provided which recovers a connected status between a first terminal of a first connector and a second terminal which is provided in a second connector and electrically connected to the first terminal, the connector connection regenerating system including: a regeneration circuit for conducting a regeneration current to the first terminal, the regeneration current being capable to remove a foreign material between respective terminal connecting sections of the first and second terminals; a first connecting circuit which connects the first terminal switchably to a signal circuit and to the regeneration circuit, the signal circuit being provided for conducting a signal current to the first terminal; a ground circuit for conducting to a predetermined ground the regeneration current which has flown to the second terminal via the first terminal; a second connecting circuit which connects the second terminal switchably to a predetermined downstream circuit and to the ground circuit; and a controller configured to control the first connecting circuit and the second connecting circuit upon a recovery instruction for the connected status so as to switch the first terminal from the signal circuit to the regeneration circuit and to switch the second terminal from the downstream circuit to the ground circuit.

Furthermore, in order to achieve the above mentioned objective, a connector connection regenerating method according to the present invention is provided which recovers a connected status between a first terminal of a first connector and a second terminal which is provided in a second connector and electrically connected to the first terminal, the connector connection regenerating method including: a first connecting step for switching the first terminal from a signal circuit to a regeneration circuit upon receipt of a recovery instruction for the connected status, wherein the signal circuit is provided for conducting a signal current to the first terminal and the regeneration circuit is provided for conducting to the first terminal a regeneration current capable to remove a foreign material between respective terminal connecting sections of the first and second terminals; a second connecting step for switching the second terminal from a predetermined downstream circuit to a ground circuit upon receipt of the recovery instruction for the connected status, wherein the ground circuit is provided for conducting to a predetermined ground the regeneration current which has arrived via the first terminal from a predetermined downstream circuit; and a regeneration step for applying the regeneration current to the regeneration circuit and conducting it from the first terminal to the ground via the ground circuit in order to remove the foreign material.

With the connector connection regenerating system and the connector connection regenerating method according to the present invention, a foreign material such as oxide coating between the terminal connecting sections can be removed by applying the regeneration current to the first terminal and the second terminal using circuit switching. In other words, when a failure occurs due to such a foreign material, e.g. when a connection resistance at a terminal connecting section increases unallowably, a connected status between the terminal connecting sections can be recovered without separating the first and the second connector from each other. This enables failures regarding connector connections to be solved with reduced costs when such a failure occurs.

DETAILED DESCRIPTION OF THE EMBODIMENTS

Hereinafter, an embodiment of the present invention will be described. First, a first embodiment shall be explained.

Figure 1:
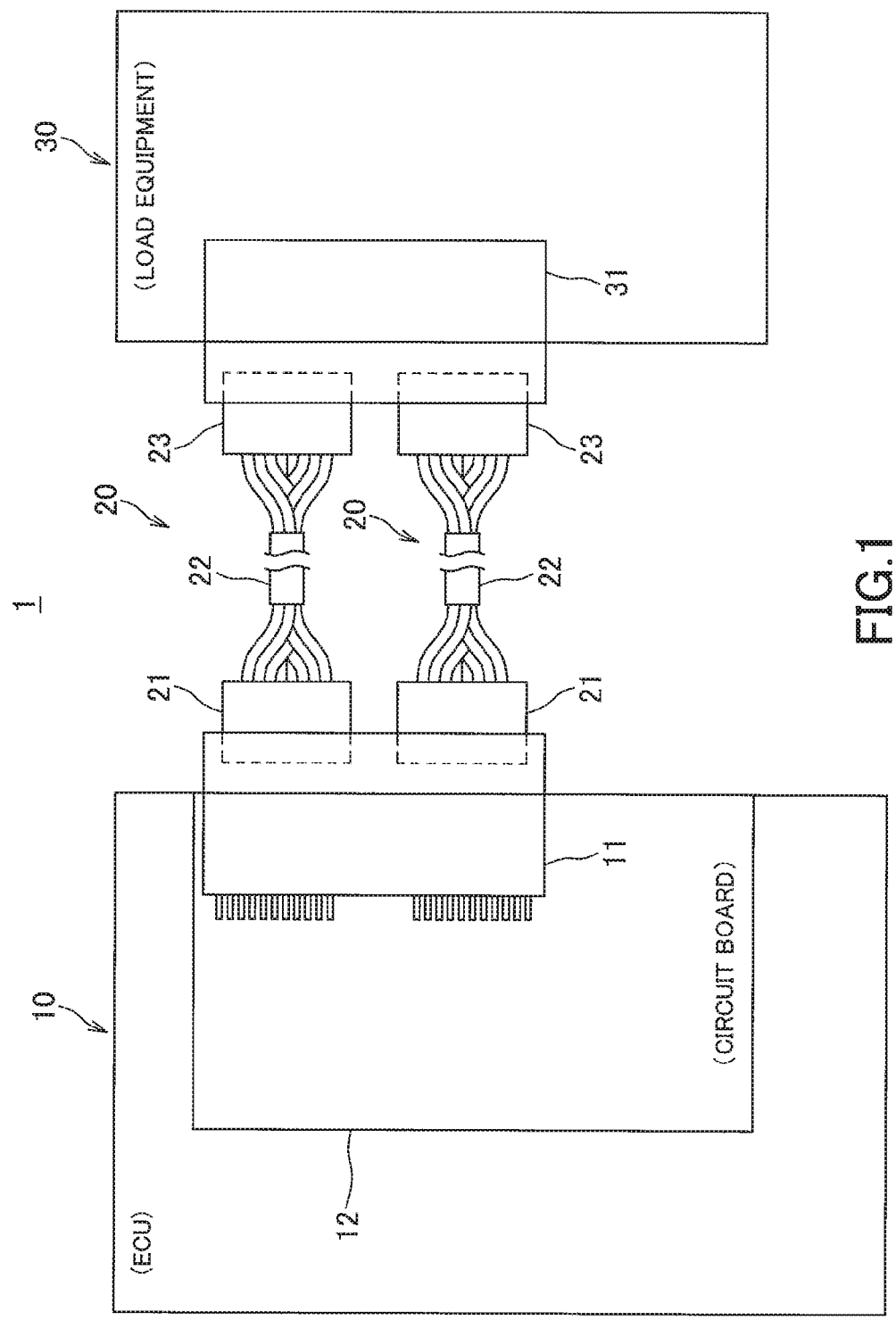
FIG. 1. is a schematic diagram illustrating an equipment connection structure to which a connector connection regenerating system according to a first embodiment of the present invention.

FIG. 1 is a schematic diagram illustrating an equipment connection structure to which a connector connection regenerating system according to the first embodiment of the present invention.

The equipment connection structure 1 according to the present embodiment is configured so that an ECU (Electronic Control Unit) 10 is connected to a predetermined load equipment 30 via two wire harnesses 20, wherein the ECU 10 is arranged in a vehicle and performs electric control processes for each of devices within the vehicle. The ECU 10 is equipped with an ECU connector 11 (first connector) as an equipment connector which forms an interface to an external system. The ECU connector 11 is a board connector which is mounted within the ECU 10 on a circuit board 12 undertaking various functions of the ECU 10. Each of the wire harnesses 20 includes a harness main body 22, an ECU-side harness connector 21 and a load-side harness connector 23 which are provided at ends of the harness main body 22 facing the ECU and the load, respectively. Furthermore, the ECU-side harness connector 21 is connected to the ECU connector 11 and the load-side harness connector 23 is connected to an equipment connector 31 (second connector) which is provided at the load equipment. According to the present embodiment, the ECU-side harness connector 21 and the load-side harness connector 23 at the wire harness 20 are female connectors while both of the ECU connector 11 and the equipment connector 31 are male connectors.

A connector connection regenerating system is integrated in this equipment connection structure 1. The connector connection regenerating system recovers a connected status between respective terminal connecting sections in terminals of the connectors when an electrically connected status between terminals of the ECU connector 11 and the equipment connector 31 through the wire harness 20 is degraded.

Figure 2:
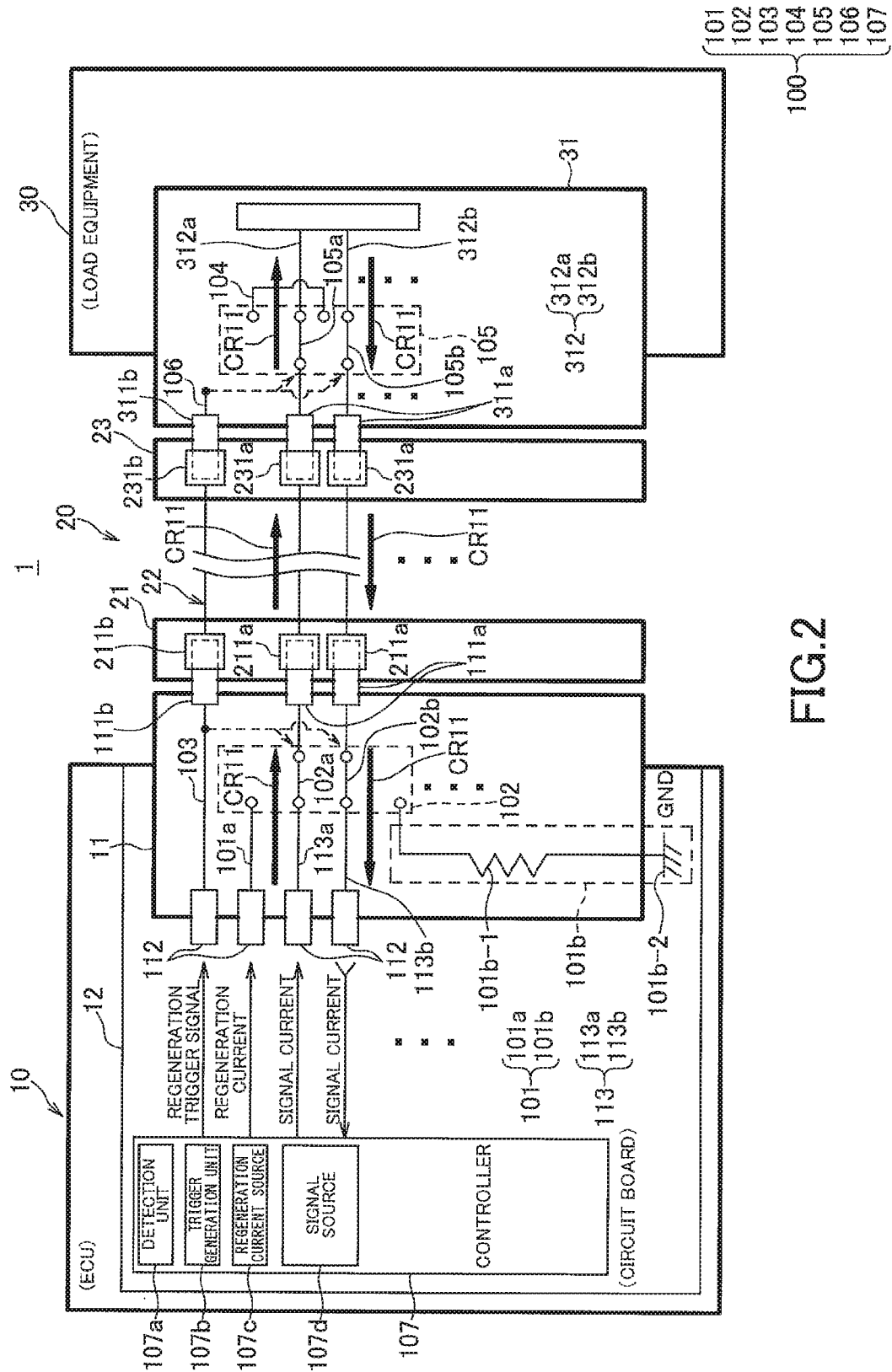
FIG. 2. is a schematic diagram illustrating the connector connection regenerating system which is integrated in the equipment connection structure as shown in FIG. 1.

FIG. 2 is a schematic diagram illustrating the connector connection regenerating system which is integrated in the equipment connection structure as shown in FIG. 1. It is to be noted that illustrating one of the two wire harnesses 20 shown in FIG. 1 is omitted in this FIG. 2.

The connector connection regenerating system 100 is a system which recovers a connected status of terminal connecting sections at first signal terminals 111a (first terminals) of the ECU connector 11 in relation to first signal harness terminals 211a. Furthermore, the connector connection regenerating system 100 also recovers a connected status of terminal connecting sections at second signal terminals 311a (second terminal) of the equipment connector 31 in relation to second signal harness terminals 231a.

The first signal terminals 111a are ones of male terminals of the ECU connector 11 which are related to applying a signal current CR11. According to the present embodiment, the signal current CR11 serves for engine control of the vehicle. A pair of first signal terminals 111a is provided for forward and return transfer for one signal current CR11. In addition to the first signal terminals 111a, the ECU connector 11 includes a first trigger terminal 111b as a male terminal which is related to applying a regeneration trigger signal as described below. Furthermore, according to the present embodiment, two ECU-side harness connectors 21 are connected to the ECU connector 11. Accordingly, a further terminal set including first signal terminals 111a and a first trigger terminal 111b is provided in the ECU connector 11.

The second signal terminals 311a are ones of male terminals of one equipment connector 31 which are related to applying a signal current CR11, wherein the second signal terminals 311a connect to the first signal terminals 111a of the ECU connector 11 via the wire harnesses 20. Similarly to the first signal terminals 111a of the ECU connector 11, a pair of second signal terminals 311a is provided for forward and return transfer for one signal current CR11. Furthermore, the equipment connector 31 includes further male terminals such as a second trigger terminal 311b which is related to applying the regeneration trigger signal. The second trigger terminal 311b connects to the first trigger terminal 111b of the ECU connector 11.

The ECU-side harness connector 21 includes first signal harness terminals 211a and a first trigger harness terminal 211b, the harness terminals 211a for the first signal being female terminals connected to the first signal terminals 111a of the ECU connector 11 and the first trigger harness terminal 211b being a female terminal connecting to the first trigger terminal 111b. Furthermore, the load-side harness connector 23 includes second signal harness terminals 231a and a second trigger harness terminal 231b, the second signal harness terminals 231a being female terminals connecting to the second signal terminals 311a of the equipment connector 31 and the second trigger harness terminal 231b being a female terminal connecting to the second trigger terminal 311b. The terminals of the ECU-side harness connector 21 are connected electrically conductively to the respective terminals of the load-side harness connector 23 in a one-to-one manner via electric wires which form harness main bodies 22.

The connector connection regenerating system 100 according to the present embodiment recovers a connected status between male/female terminals related to applying the signal current CR11. The connector connection regenerating system 100 includes a regeneration circuit 101, a first connecting circuit 102, a first circuit for control 103, a ground circuit 104, a second connecting circuit 105, a second circuit for control 106 and a controller 107. The regeneration circuit 101, the first connecting circuit 102 and the first circuit for control 103 are integrated within the ECU connector 11, while the ground circuit 104, the second connecting circuit 105 and the second circuit for control 106 are integrated within the equipment connector 31. The controller 107 is implemented on the circuit board 12.

The regeneration circuit 101 conducts the regeneration current to the first signal terminals 111a, the first signal harness terminals 211a, the second signal harness terminals 231a and the second signal terminals 311a. The regeneration current has a magnitude which enables foreign materials to be removed which exist between the first signal terminals 111a and the first signal harness terminals 211a and/or between the second signal harness terminals 231a and the second signal terminals 311a. Oxide coatings may be formed as foreign material between terminals, wherein the oxide coatings are formed over time on respective contact faces of terminals. Such a foreign material formed between terminals may result in an increased connection resistance between the terminals which may inhibit conducting the signal current CR11. The regeneration circuit 101 removes the foreign material by conducting the regeneration current supplied from the controller 107 between the terminals from which the foreign material should be removed.

The regeneration circuit 101 includes a current transmission line 101a and a return current grounding path 101b. The current transmission line 101a is a conductive path which conducts the regeneration current received from the controller 107 via a board connection terminal 112 in the ECU connector 11, to a first signal terminal 111a on a forward path. The return current grounding path 101b is an electrically active path which conducts the regeneration current which has finished its function of foreign material removal and returned to a first signal terminals 111a on a return path, to a predetermined ground 101b-2 via a resistance element 101b-1. The resistance element 101b-1 is arranged so as to be located between the first signal terminal 111a and the ground 101b-2 so that the electrically active path for the regeneration current may not form a short-circuit path.

The first connecting circuit 102 connects the pair of first signal terminals 111a switchably to a signal circuit 113 for conducting the signal current and to the above mentioned regeneration circuit 101, respectively.

The signal circuit 113 includes a signal forward path 113a and a signal return path 113b.

The signal forward path 113a is a conductive path which conducts the signal current CR11 received from the controller 107 via the board connection terminal 112, to the first signal terminal 111a on the forward path. The signal return path 113b is a conductive path which conducts the signal current CR11 returned to the first signal terminal 111a on the return path, to the controller 107 via the board connection terminal 112.

The first connecting circuit 102 includes a three-contact relay 102a for the forward path and a three-contact relay 102b for the return path. The three-contact relay 102a for the forward path connects the first signal terminal 111a on the forward path switchably to the current transmission line 101a of the regeneration circuit 101 and to the signal forward path 113a of the signal circuit 113. The three-contact relay 102b for the return path connects the first signal terminal 111a on the return path switchably to the return current grounding path 101b of the regeneration circuit 101 and to the signal return path 113b of the signal circuit 113.

The first circuit for control 103 is a conductive path which supplies the regeneration trigger signal received from the controller 107 via the board connection terminal 112, to each of contact driving units of the three-contact relays 102a and 102b for the forward path and the return path in the first connecting circuit 102. The first circuit for control 103 is also a conductive path which conducts the regeneration trigger signal to the first trigger terminal 111b. The regeneration trigger signal conducted to the first trigger terminal 111b is transferred to the second circuit for control 106 via the first trigger harness terminal 211b of the ECU-side harness connector 21 and via the second trigger harness terminal 231b of the load-side harness connector 23.

When applying the regeneration trigger signal by the first circuit for control 103, in the first connecting circuit 102, the three-contact relay 102a for the forward path connects the first signal terminal 111a on the forward path to the current transmission line 101a of the regeneration circuit 101. Additionally at this time, the three-contact relay 102b for the return path connects the first signal terminal 111a on the return path to the return current grounding path 101b of the regeneration circuit 101. When no regeneration trigger signal is applied, the three-contact relay 102a for the forward path connects the first signal terminal 111a on the forward path to the signal forward path 113a of the signal circuit 113, while the three-contact relay 102b for the return path connects the first signal terminal 111a on the return path to the signal return path 113b of the signal circuit 113.

The ground circuit 104 is a short-circuit conductive path for conducting to the ground 101b-2 the regeneration current which has flown to a second signal terminal 311a on a forward path in the equipment connector 31. The regeneration current flows from the first signal terminal 111a on the forward path in the ECU connector 11 to the second signal terminal 311a on the forward path in the equipment connector 31 via the first and second signal harness terminals 211a and 231a. The ground circuit 104 short-circuits a second signal terminal 311a on the forward path and a second signal terminal 311a on a return path in the equipment connector 31. In this manner, it is provided that the regeneration current is conducted back to the first signal terminal 111a on the return path in the ECU connector 11 via the second signal terminal 311a on the return path and then to the ground 101b-2.

The second connecting circuit 105 connects the second signal terminals 311a on the forward and return paths switchably to the ground circuit 104 and to a downstream circuit 312 which leads to an internal circuit of the load equipment 30.

The downstream circuit 312 includes a signal forward path 312a and a signal return path 312b. The signal forward path 312a is a conductive path which conducts the signal current CR11 received by the second signal terminal 311a on the forward path, to the internal circuit of the load equipment 30. The signal return path 312b is a conductive path which conducts the signal current CR11 flown to it from the internal circuit, to the second signal terminal 311a on the return path.

The second connecting circuit 105 includes a three-contact relay 105a for the forward path and a three-contact relay 105b for the return path. The three-contact relay 105a for the forward path connects the second signal terminal 311a on the forward path switchably to an end of the ground circuit 104 on the forward path and to the signal forward path 312a of the downstream circuit 312. The three-contact relay 105b for the return path connects the second signal terminal 311a on the return path switchably to an end of the ground circuit 104 on the return path and to the signal return path 312b of the downstream circuit 312.

The second circuit for control 106 is a conductive path which supplies the regeneration trigger signal received by the second trigger terminal 311b of the equipment connector 31, to each of contact driving units of the three-contact relays 105a and 105b for the forward path and the return path in the second connecting circuit 105. When applying the regeneration trigger signal by the second circuit for control 106, in the second connecting circuit 105, the three-contact relay 105a for the forward path connects the second signal terminal 311a on the forward path to the end of the ground circuit 104 on the forward path. Additionally at this time, the three-contact relay 105b for the return path connects the second signal terminal 311a on the return path to the end of the ground circuit 104 on the return path. When no regeneration trigger signal is applied, the three-contact relay 105a for the forward path connects the second signal terminal 311a on the forward path to the signal forward path 312a of the downstream circuit 312, while the three-contact relay 105b for the return path connects the second signal terminal 311a on the return path to the signal return path 312b of the downstream circuit 312.

The controller 107 is implemented on the circuit board 12 in the ECU 10. In normal status, the controller 107 performs transmission and receipt of the signal current CR11 to and from the ECU connector 11. If a regeneration event occurs which instructs a recovery of a connected status between terminals, the controller 107, upon this event, inputs the regeneration trigger signal to the board connection terminal 112 which is conductively connected to the first trigger terminal 111b of the ECU connector 11. In this way, the controller 107 controls the first connecting circuit 102 and the second connecting circuit 105 so as to switch the connection of the pair of first signal terminals 111a from the signal circuit 113 to the regeneration circuit 101 and to switch the connection of the second signal terminals 311a from the downstream circuit 312 to the ground circuit 104. After this switching, the controller 107 inputs the regeneration current to the board connection terminal 112 of the ECU connector 11 which leads to the current transmission line 101a of the regeneration circuit 101. Then, when a predetermined regeneration time has lapsed, inputting the regeneration current and the regeneration trigger signal is stopped. With stopping input of the regeneration trigger signal, the connection of the pair of first signal terminals 111a is switched from the regeneration circuit 101 to the signal circuit 113 and the connection of the second signal terminals 311a from the ground circuit 104 to the downstream circuit 312.

The controller 107 includes a detection unit 107a, a trigger generation unit 107b, a regeneration current source 107c and a signal source 107d as functional units.

The detection unit 107a detects occurrence of the regeneration event. According to the present embodiment, as the regeneration event, an abnormal reduction of the signal current CR11 is used for which an increase of a connection resistance between the first signal terminals 111a and the first signal harness terminals 211a as well as an increase of a connection resistance between the second signal harness terminals 231a and the second signal terminals 311a can be expected. In addition thereto, coming up of a regular maintenance period may be used as the regeneration event. When occurrence of the above described regeneration event has been detected in the detection unit 107a, the trigger generation unit 107b, upon this, inputs the regeneration trigger signal to the board connection terminal 112 which is conductively connected to the first trigger terminal 111b.

After inputting the regeneration trigger signal, the regeneration current source 107c inputs the regeneration current to the board connection terminal 112 of the ECU connector 11 which leads to the current transmission line 101a of the regeneration circuit 101. When a predetermined regeneration time has lapsed after inputting the regeneration current, the regeneration current source 107c stops inputting the regeneration current and the trigger generation unit 107b stops inputting the regeneration trigger signal.

The signal source 107d inputs the signal current CR11 to the ECU connector 11 which leads to the signal forward path 113a in the signal circuit 113, and receives the signal current CR11 from the board connection terminal 112 which leads to the signal return path 113b. Such transmission and receipt of the signal current CR11 is performed during a normal period, excluding a time after the occurrence of the regeneration event has been detected at the detection unit 107a and until input of the regeneration current and the regeneration trigger signal are stopped.

FIG. 2 shows how the signal current CR11 flows the equipment connection structure 1 during the normal period. The connector connection regenerating system 100 integrated into this equipment connection structure 1 performs processes according to the following connector connection regenerating method.

Figure 3:
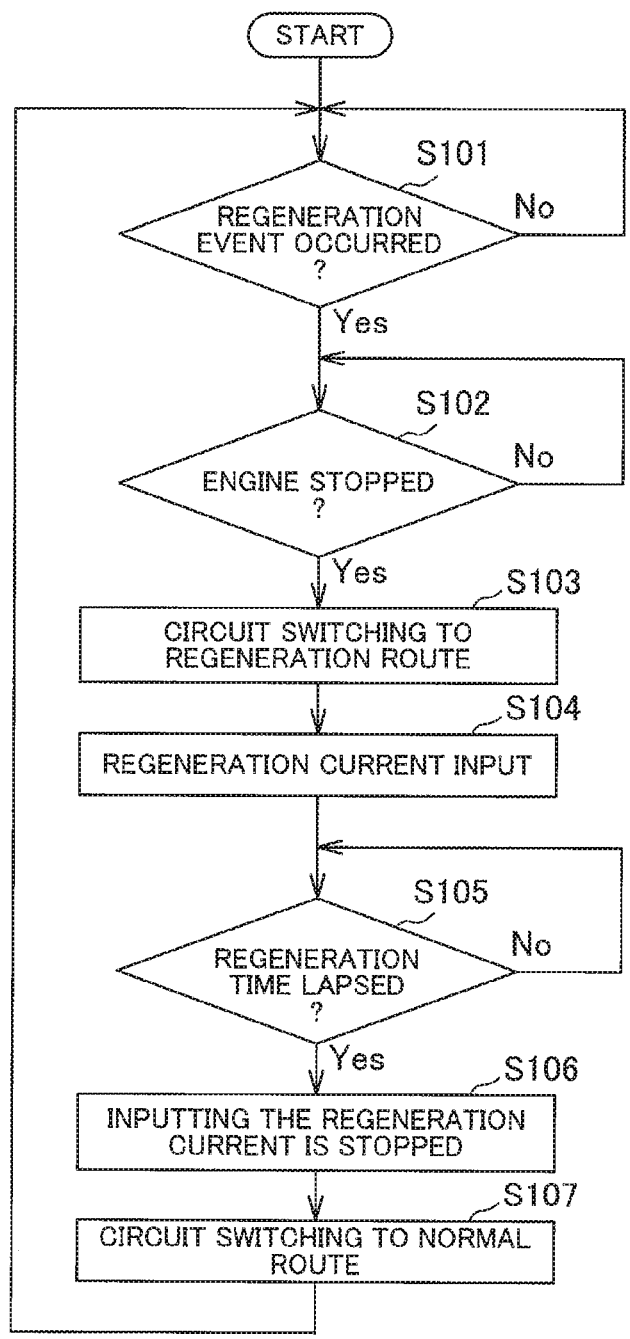
FIG. 3. is a flow chart illustrating a process flow according to a connector connection regenerating method which is implemented with the connector connection regenerating system as shown in FIG. 2.

FIG. 3 is a flow chart illustrating a process flow according to a connector connection regenerating method which is implemented with the connector connection regenerating system as shown in FIG. 2.

The processes according to the connector connection regenerating method as shown by the flow chart of FIG. 3 starts when devices including the ECU 10 have been powered up in a vehicle which is equipped with the equipment connection structure 1. After the processes have started, it is determined by the detection unit 107a of the controller 107 in the connector connection regenerating system 100 whether the above described regeneration event has occurred (step S101). If the regeneration event has not occurred (NO-determination in step S101), the determination of the step S101 is repeated.

If the regeneration event has occurred (YES-determination in step S101), it is determined by the trigger generation unit 107b of the controller 107 whether an engine of the vehicle is stopped, i.e. whether the signal current CR11 for the engine control flows or not (step S102). If the engine is not stopped (NO-determination in step S102), the determination of the step S102 is repeated.

When the engine stops (YES-determination in step S102), the trigger generation unit 107b inputs the regeneration trigger signal to the board connection terminal 112 which leads to the first trigger terminal 111b in the ECU connector 11 (step S103). Upon the regeneration trigger signal, circuit switching is performed in the first connecting circuit 102 of the ECU connector 11 and/or in the second connecting circuit 105 of the equipment connector 31 to form a regeneration route for conducting the regeneration current. If the regeneration route has been formed, the regeneration current source 107c of the controller 107 inputs the regeneration current to the board connection terminal 112 which is conductively connected to the current transmission line 101a of the regeneration circuit 101 in the ECU connector 11 (step S104).

Figure 4:
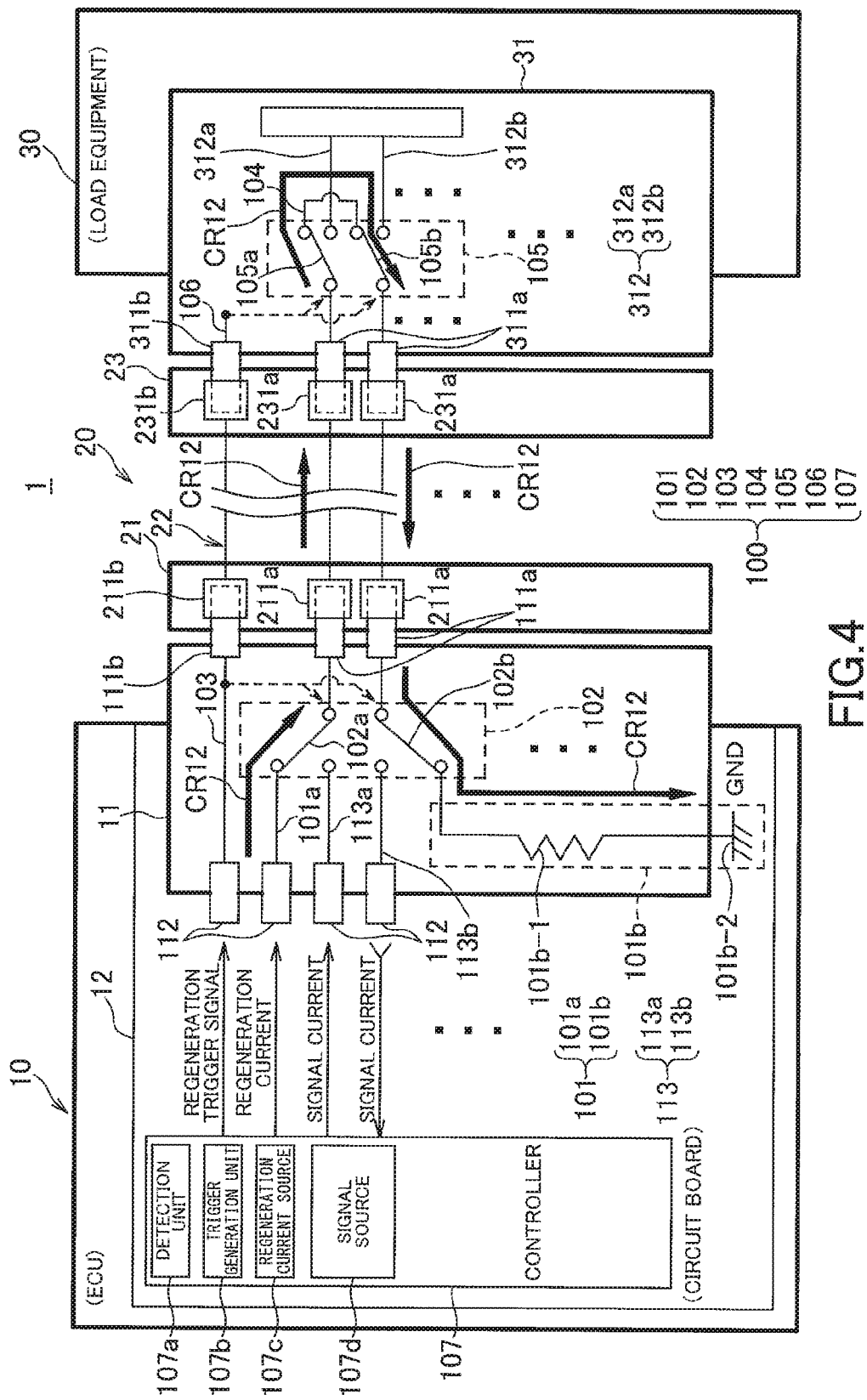
FIG. 4. is a schematic diagram illustrating how circuit switching is performed, a regeneration route is formed and a regeneration current is applied to the regeneration route in the connector connection regenerating system as shown in FIG. 2.

FIG. 4 is a schematic diagram illustrating how circuit switching is performed, a regeneration route is formed and a regeneration current is applied to the regeneration route in the connector connection regenerating system as shown in FIG. 2.

As shown in this FIG. 4, in the first connecting circuit 102 of the ECU connector 11, the three-contact relay 102a for the forward path connects, upon receipt of the regeneration trigger signal via the board connection terminal 112, the first signal terminal 111a on the forward path to the current transmission line 101a of the regeneration circuit 101. Additionally, the three-contact relay 102b for the return path connects the first signal terminal 111a on the return path to the return current grounding path 101b in the regeneration circuit 101. The connection operation of the first connecting circuit 102 in step S103 in FIG. 3 is a first connecting step in which the first signal terminals 111a are switched and connected from the signal circuit 113 to the regeneration circuit 101 upon a recovery instruction for the connected status.

The regeneration trigger signal is transferred from the first trigger terminal 111b of the ECU connector 11 to the second connecting circuit 105 via the first trigger harness terminal 211b, the second trigger harness terminal 231b, the second trigger terminal 311b and the second circuit for control 106. In the second connecting circuit 105, the three-contact relay 105a on the forward path connects, upon receipt of the regeneration trigger signal, the second signal terminal 311a on the forward path to the end of the ground circuit 104 on the forward path. Additionally, the three-contact relay 105b for the return path connects the second signal terminal 311a on the return path to the end of the ground circuit 104 on the return path. The connection operation of the second connecting circuit 105 in step S103 in FIG. 3 is a second connecting step in which the second signal terminals 311a are switched and connected from the downstream circuit 312 to the ground circuit 104 upon a recovery instruction for the connected status.

With the above circuit switching, the regeneration route is formed which leads from the board connection terminal 112 conductively connected to the current transmission line 101a of the regeneration circuit 101, via the ground circuit 104 of the equipment connector 31 to the ground 101b-2 of the return current grounding path 101b of the regeneration circuit 101. The regeneration current source 107c of the controller 107 inputs the regeneration current CR12 to the board connection terminal 112 which forms a start point of this regeneration route. This regeneration current CR12 flows along the above described regeneration route.

Once the input of the regeneration current CR12 has begun in step S104 of the flow chart according to FIG. 3, the regeneration current source 107c of the controller 107 determines whether a predetermined regeneration time has lapsed after beginning the input of the regeneration current CR12 (step S105). If the predetermined regeneration time has not lapsed (No-determination in step S105), the determination of the step S105 is repeated. During this, the regeneration current CR12 continues to flow through the above described regeneration route. In this way, for each of the forward and return paths of the regeneration route, a foreign material such as oxide coating is removed which exits between the first signal terminal 111a and the first signal harness terminal 211a and/or between the second signal harness terminal 231a and the second signal terminal 311a. The processes in steps S104 and S105 are a regeneration step in which the regeneration current CR12 is applied to the regeneration circuit 101 and caused to flow from the first signal terminal 111a through the second signal terminal 311a via the ground circuit 104 to the ground 101b-2 in order to remove the foreign material.

When the predetermined regeneration time has lapsed (Yes-determination in step S105), the regeneration current source 107c stops inputting the regeneration current CR12 (step S106). Then, the trigger generation unit 107b in the controller 107 stops inputting the regeneration trigger signal (step S107). Upon this stopping the input of the regeneration trigger signal, circuit switching is carried out in the first connecting circuit 102 of the ECU connector 11 and/or in the second connecting circuit 105 of the equipment connector 31, wherein a normal route for conducting the signal current CR11 as shown in FIG. 2 is formed.

In the circuit switching to the normal route, the three-contact relay 102a for the forward path in the first connecting circuit 102 of the ECU connector 11, as shown in FIG. 2, connects the first signal terminal 111a on the forward path to the signal forward path 113a of the signal circuit 113. Furthermore, the three-contact relay 102b for the return path connects the first signal terminal 111a on the return path to the signal return path 113b of the signal circuit 113. Additionally, three-contact relay 105a for the forward path in the second connecting circuit 105 of the equipment connector 31 connects the second signal terminal 311a on the forward path to the signal forward path 312a in the downstream circuit 312. Moreover, the three-contact relay 105b for the return path connects the second signal terminal 311a on the return path to the signal return path 312b in the downstream circuit 312.

With the above circuit switching, the normal route is formed which leads from the board connection terminal 112 conductively connected to the signal forward path 113a in the signal circuit 113, via the internal circuit of the load equipment 30 to the board connection terminal 112 which is conductively connected to the signal return path 113b in the signal circuit 113. After start of the engine of the vehicle, the signal source 107d in the controller 107 input the signal current CR11 to the board connection terminal 112 as required, wherein the board connection terminal 112 forms a start point of this normal route. This signal current CR11 flows along the above described normal route.

With the connector connection regenerating system 100 and the connector connection regenerating method according to the above described embodiment, the following effect can be achieved: first, with the above described circuit switching, foreign materials such as oxide coating between terminal connecting sections can be removed by applying the regeneration current CR12 to the first signal terminals 111a and the second signal terminals 311a. This means that, when a failure has occurred due to such a foreign material, e.g. when a connection resistance at a terminal connecting section increases unallowably, a connected status at the terminal connecting section can be recovered without removing the wire harness 20 and separating the ECU connector 11 and the equipment connector 31 from each other. This enables failures regarding connector connections to be solved with reduced costs when such a failure occurs.

Furthermore, according to the present embodiment, the regeneration circuit 101 and the first connecting circuit 102 are integrated in the ECU connector 11 together with the signal circuit 113, while the ground circuit 104 and the second connecting circuit 105 are integrated in the equipment connector 31 together with the downstream circuit 312.

According to the present embodiment, the connector connection regenerating system 100 can be miniaturized, since the circuits which constitute the connector connection regenerating system 100 are distributed in the ECU connector 11 and the equipment connector 31.

Furthermore, according to the present embodiment, a pair of first signal terminals 111a as well as a pair of second signal terminals 311a are provided for forward and return transfer for one signal current CR11. The ground 101b-2 is arranged in the ECU 10 at which the ECU connector 11 is arranged. The regeneration current CR12 is conducted as follows:

First, the regeneration circuit 101 inputs the regeneration current CR12 to one of the pair of first signal terminals 111a and connects the other of the pair of first signal terminals 111a to the ground 101b-2.

Furthermore, the ground circuit 104 short-circuits the pair of second signal terminals 311a with each other. In this manner, the regeneration current CR12 which has been conducted to one of the second signal terminals 311a via the one first signal terminal 111a is returned to the other first signal terminal 111a via the other of the second signal terminals 311a. The returned regeneration current CR12 is conducted through the first signal terminal 111a to the ground 101b-2.

According to the present embodiment, the regeneration current CR12 flows via the forward and return paths for the signal current CR11. In this manner, a connected status between the first signal terminals 111a and the first signal harness terminals 211a as well as a connected status between the second signal harness terminals 231a and the second signal terminals 311a on each of the forward and return routes can be recovered at the same time.

Next, a second embodiment shall be explained. According to the first embodiment as described above, the connector connection regenerating system 100 is applied to an equipment connection structure 1 between an ECU 10 and a load equipment 30 via the wire harnesses 20. In contrary, according to the second embodiment, a connector connection regenerating system 100 similar to that of the first embodiment as described above is applied individually to a harness connection structure for an ECU 10 and/or to a harness connection structure for a load equipment 30. Now, the second embodiment shall be explained with using a harness connection structure for an ECU 10 as an example.

Figure 5:
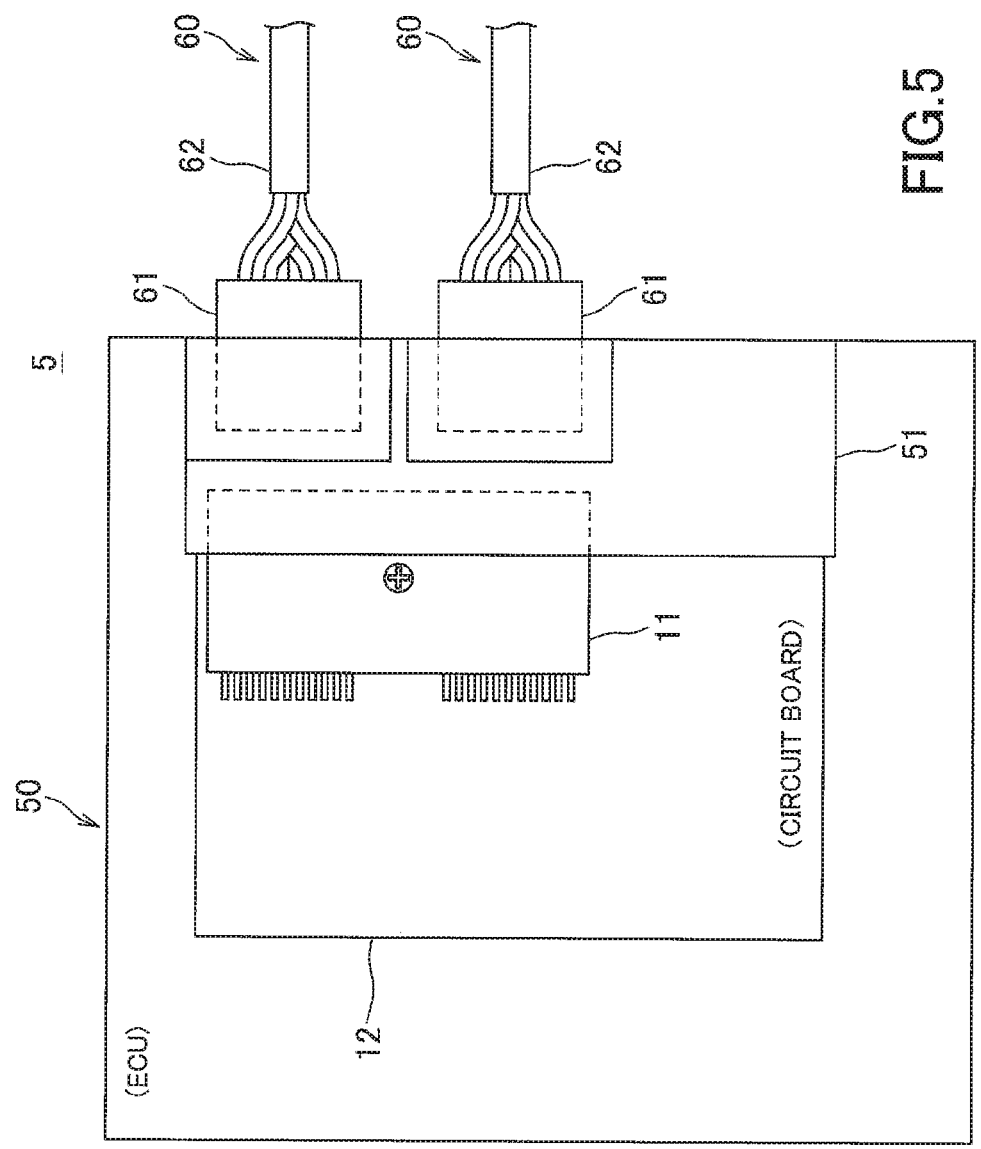
FIG. 5. is a schematic diagram illustrating a harness connection structure for an ECU to which a connector connection regenerating system according to a second embodiment of the present invention.

FIG. 5 shows is a schematic diagram illustrating a harness connection structure for an ECU to which a connector connection regenerating system according to the second embodiment of the present invention. It is to be noted that in FIG. 5, components similar to those shown in FIG. 1 are designated with the same reference signs as in FIG. 1, wherein explanation of these similar components shall not be repeated below.

A harness connection structure 5 according to the present embodiment is configured so that two wire harnesses 60 are connected to the ECU 50. The ECU 50 is equipped with a relay connector 51 as an equipment connector which forms an interface to an external system. An ECU connector 11 (first connector) is connected to the relay connector 51, the ECU connector 11 being mounted on a circuit board 12 within the ECU 50. Each of the wire harnesses 60 includes a harness main body 62 and an ECU-side harness connector 61 (second connector) which is provided at an end of the harness main body 62. Outside the ECU 50, the ECU-side harness connector 61 of each of the wire harnesses 60 is connected to the relay connector 51. According to the present embodiment, the relay connector 51 is a female connector, while both of the ECU-side harness connector 61 and the ECU connector 11 are male connectors.

A connector regenerating system 100 similar to that of the first embodiment as described above is integrated in this harness connection structure 5. According to the present embodiment, the connector regeneration system 100 recovers a connected status at terminal connecting sections in terminals of each connector when an electrically connected status between terminals of the ECU connector 11 and the ECU-side harness connector 61 via the relay connector 51 is degraded.

Figure 6:
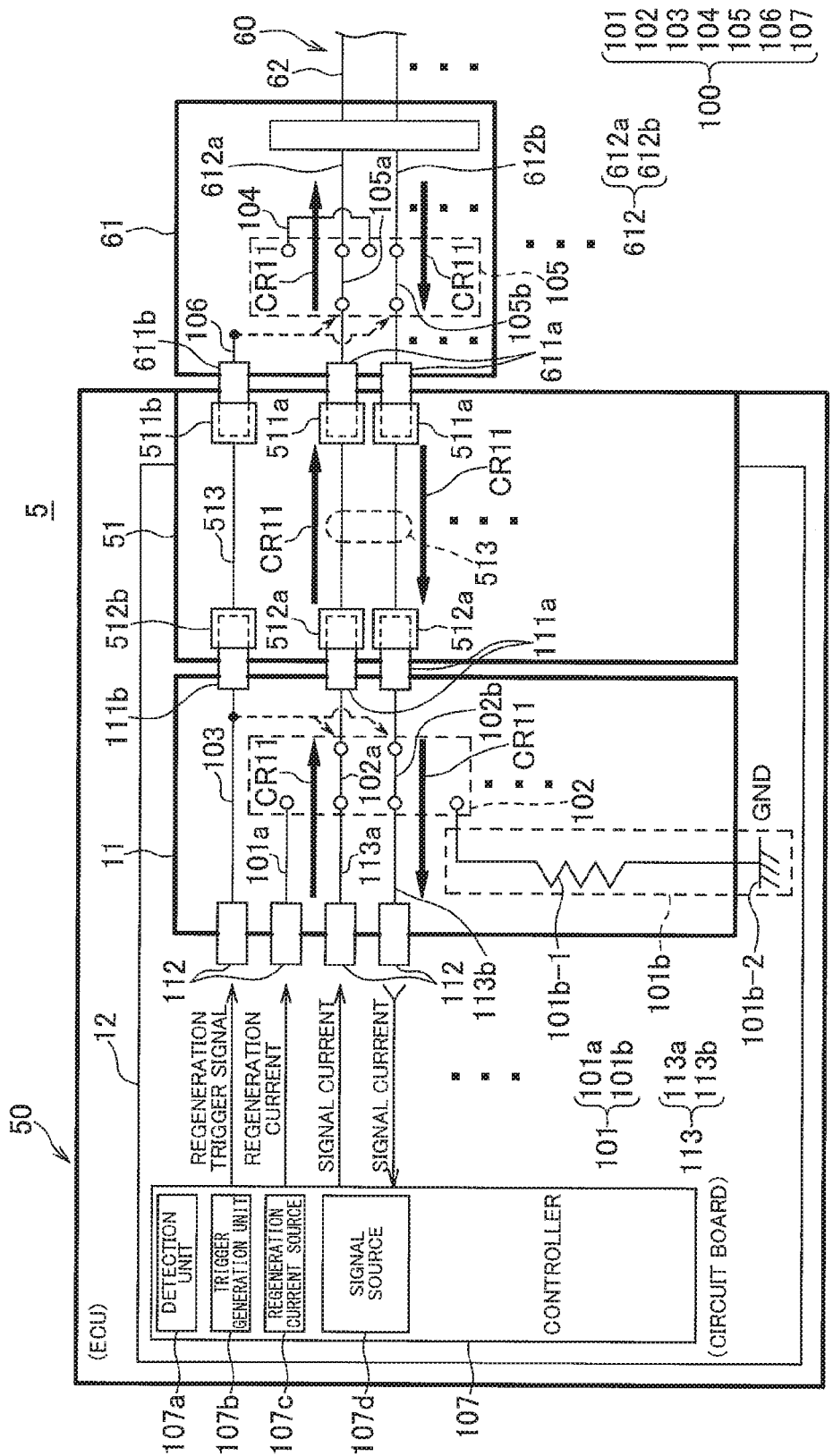
FIG. 6. is a schematic diagram illustrating the connector connection regenerating system which is integrated in the harness connection structure as shown in FIG. 5.

FIG. 6 is a schematic diagram illustrating the connector connection regenerating system which is integrated in the harness connection structure as shown in FIG. 5. It is to be noted that illustrating one of the two wire harnesses 60 which are shown in FIG. 5 is omitted in this FIG. 6. Furthermore, also in FIG. 6, components similar to those shown in FIG. 2 are designated with the same reference signs as in FIG. 2, wherein explanation of these similar components shall not be repeated below.

According to the present embodiment, the connector connection regenerating system 100 recovers a connected status between first signal terminals 111a (first terminals) in the ECU connector 11 and second signal relay terminals 512a. At the same time, the connector connection regenerating system 100 also recovers a connected status between second signal terminals 611a (second terminals) in the ECU-side harness connector 61 and the first signal relay terminals 511a.

The first and second signal relay terminals 511a and 512a are ones of female terminals of the relay connector 51 which are related to applying the signal current CR11, and conductively connected to each other via an internal conductive line 513. A pair of first signal relay terminals 511a as well as a pair of second signal relay terminals 512a are provided for forward and return transfer for one signal current CR11. In addition to the first and second signal relay terminals 511a and 512a, female terminals of the relay connector 51 also include a first trigger relay terminal 511b and a second trigger relay terminal 512b etc. which are related to applying the regeneration trigger signal. Furthermore, according to the present embodiment, two ECU-side harness connectors 61 are connected to the relay connector 51. Accordingly, the relay connector 51 includes a further terminal set with first signal relay terminals 511a, second signal relay terminals 512a, a first trigger relay terminal 511b and a second trigger relay terminal 512b.

The second signal terminals 611a are ones of male terminals of one ECU-side harness connector 61 which are related to applying the signal current CR11, and connect to the first signal relay terminals 511a of the relay connector 51. Similarly to the first signal relay terminals 511a of the relay connector 51, a pair of second signal terminals 611a is provided for forward and return transfer for one signal current CR11. The ECU-side harness connector 61 also includes further male terminals such as a second trigger terminal 611b which is related to applying the regeneration trigger signal. The second trigger terminal 611b connects to the first trigger relay terminal 511b of the relay connector 51.

The first signal terminals 111a are ones of male terminals of the ECU connector 11 which are related to applying the signal current CR11, and connect to the second signal relay terminals 512a of the relay connector 51. Similarly to the second signal relay terminals 512a of the relay connector 51, a pair of first signal terminals 111a is provided for forward and return transfer for one signal current CR11. Furthermore, the ECU connector 11 includes further male terminals such as a first trigger terminal 111b which is related to applying the regeneration trigger signal. The first trigger terminal 111b connects to the second trigger relay terminal 512b of the relay connector 51. Moreover, the ECU connector 11 includes a further terminal set with first signal terminals 111a and a first trigger terminal 111b so as to correspond to two ECU-side harness connectors 61 which are connected to the relay connector 51.

The connector connection regenerating system 100 according to the present embodiment is similar to that of the above described first embodiment and includes a regeneration circuit 101, a first connecting circuit 102, a first circuit for control 103, a ground circuit 104, a second connecting circuit 105, a second circuit for control 106 and a controller 107. The regeneration circuit 101, the first connecting circuit 102 and the first circuit for control 103 are integrated within the ECU connector 11. However, according to the present embodiment, the ground circuit 104, the second connecting circuit 105 and the second circuit for control 106 are integrated within the ECU-side harness connector 61.

In normal status, the first signal terminals 111a in the ECU connector 11 are connected to the signal circuit 113 via the first connecting circuit 102 and the second signal terminals 611a in the ECU-side harness connector 61 are connected via the second connecting circuit 105 to a downstream circuit 612 which leads to the harness main bodies 62. The downstream circuit 612 includes a signal forward path 612a and a signal return path 612b. To a normal route formed in this manner, the signal current CR11 flows from the signal source 107d in the controller 107 via a board connection terminal 112.

Also in the connector connection structure 5 according to the present embodiment, similar processes to those pursuant to the connector connection regenerating method as shown by the flow chart of FIG. 3. That is, when occurrence of a regeneration event has been detected in the detection unit 107a of the controller 107, it is determined whether an engine of a vehicle is stopped or not. If the engine is stopped, the trigger generation unit 107b issues the regeneration trigger signal which is input to the ECU connector 11 via the board connection terminal 112, wherein the regeneration trigger signal is input to the ECU-side harness connector 61 via the relay connector 51. Upon the regeneration trigger signal, the first connecting circuit 102 connects the first signal terminals 111a of the ECU connector 11 to the regeneration circuit 101, and the second connecting circuit 105 connects the second signal terminals 611a of the ECU-side harness connector 61 to the ground circuit 104. In this way, the circuit route in the harness connection structure 5 is switched from the normal route to a regeneration route for conducting the regeneration current.

Figure 7:
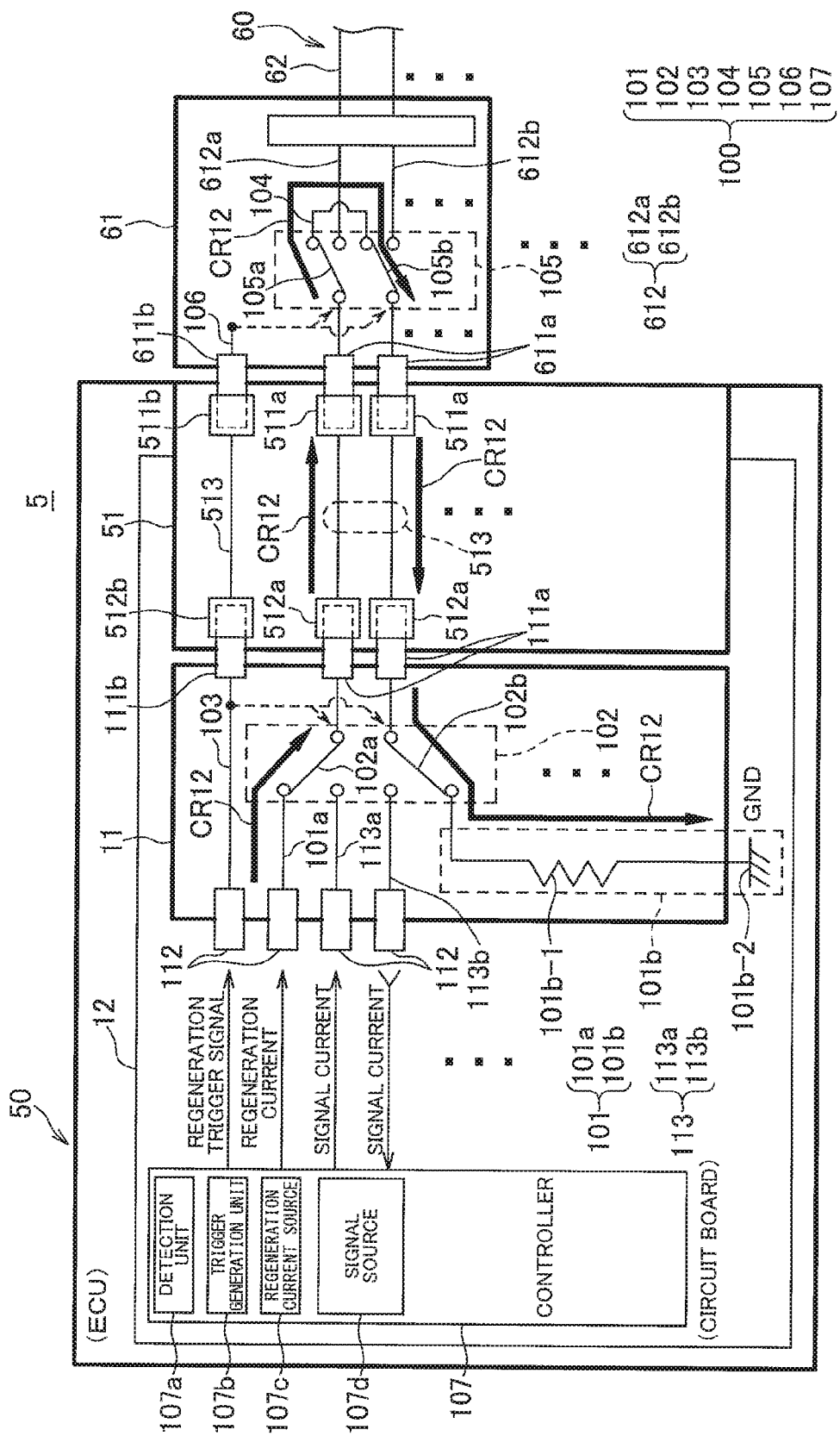
FIG. 7. is a schematic diagram illustrating how circuit switching is performed, a regeneration route is formed and a regeneration current is applied to the regeneration route in the connector connection regenerating system as shown in FIG. 6.

FIG. 7 is a schematic diagram illustrating how circuit switching is performed, a regeneration route is formed and a regeneration current is conducted to the regeneration route in the connector connection regenerating system as shown in FIG. 6. When the regeneration trigger signal has been input to the first connecting circuit 102 in the ECU connector 11, a three-contact relay 102a for the forward path connects a first signal terminal 111a on the forward path to a current transmission line 101a in the regeneration circuit 101. Additionally, a three-contact relay 102b for the return path connects a first signal terminal 111a on the return path to a return current grounding path 101b of the regeneration circuit 101. Furthermore, when the regeneration trigger signal has been input to the second connecting circuit 105 in the ECU-side harness connector 61, a three-contact relay 105a for the forward path connects a second signal terminal 611a on the forward path to an end of the ground circuit 104 on the forward path. Additionally, a three-contact relay 105b for the return path connects a second signal terminal 611a on the return path to an end of the ground circuit 104 on the return path.

With this circuit switching, the regeneration route is formed which leads from the board connection terminal 112 conductively connected to the current transmission line 101a of the regeneration circuit 101, via the ground circuit 104 of the ECU-side harness connector 61 to the ground 101b-2 of the return current grounding path 101b of the regeneration circuit 101. The regeneration current source 107c of the controller 107 inputs the regeneration current CR12 to the board connection terminal 112 which forms a start point of this regeneration route. This regeneration current CR12 flows along the above described regeneration route. Conducting the regeneration current CR12 is performed over a predetermined regeneration time. In this way, for each of the forward and return paths of the regeneration route, a foreign material such as oxide coating is removed which exits between the first signal terminal 111a and the second signal relay terminal 512a and/or between the second signal terminal 611a and the first signal relay terminal 511a. After lapse of the regeneration time, providing the regeneration trigger signal is stopped, wherein the circuit route in the harness connection structure 5 is returned to the normal route.

Although until now, the connector connection regenerating system 100 which is applied to the harness connection structure 5 for the ECU 10 has been described, the present embodiment is provided so that a similar connector connection regenerating system 100 is also applied to a harness connection structure for a load equipment 30. Also in the connector connection regenerating system 100 for the load equipment 30, similar switching of a circuit route to that of the ECU 50 is carried out, wherein the regeneration current is applied, which may enable recovery of a connected status via removal of foreign materials such as oxide coating.

Of course, also the second embodiment as described above enables failures regarding connector connections to be solved in a similar manner to the first embodiment as described above with reduced costs when the failures have occurred.

It is to be noted that the first and second embodiments as described above merely show representative configurations for the present invention and the present invention is not limited to these embodiments. In other words, various modifications may be implemented within a scope which does not depart from the core of the present invention. Such modifications also fall under the scope of the present invention as far as they include features of the connector connection regenerating system and method according to the present invention.

For example, the above described embodiments show as examples a connector connection regenerating system 100 and method which are applied to an equipment connection structure 1 or a harness connection structure 5 with two wire harnesses 20, 60 connected to an ECU 10, 50 of a vehicle. However, a connector connection regenerating system and method according to the present invention is not limited thereto. A connector connection regenerating system and method according to the present invention may be applied to any concrete configuration of structure in which a connected status is recovered for each of terminal connecting sections of a first terminal of a first connector and a second terminal of a second connector. For example, a connector connection regenerating system and method according to the present invention may be applied to a structure in which an equipment is not connected to a wire harness, but multiple equipments are directly connected via a connector without a wire harness. Furthermore, any type and/or number of wire harnesses and/or equipments to be connected to each other may be selected.

Moreover, the second embodiment as described above shows as an example a connector connection regenerating system 100 and method which are applied to a harness connection structure 5 with an ECU connector 11 and an ECU-side harness connector 61 connected to a relay connector 51. However, the inventive connector connection regenerating system and/or method may be applied to a connector connection structure in which a harness connector and/or an equipment connector of another equipment is connected to an ECU connector 11 etc. without a relay connector.

Furthermore, the above described embodiments show as an example a connector connection regenerating system 100 and method in which a connected status is recovery for terminals of a two-wire conducting path with a pair of forward and return lines for a signal current CR11. However, a connector connection regenerating system and method according to the present invention is not limited thereto. A connector connection regenerating system and/or method according to the present invention may be provided for recovering a connected status at terminals of a one-wire conducting path or for recovering a connected status at terminals of a three-wire energization path which consists of a signal, ground and opposite wires. Moreover, any number of conducting paths on which a connected status at a terminal should be recovered may be selected.

REFERENCE SIGNS LIST

1 Connector connection structure
5 Harness connection structure
10, 50 ECU
11 ECU connector (first connector)
12 Circuit board
20, 60 Wire harness
21 ECU-side harness connector
22,62 Harness main body
23 Load-side harness connector
30 Load equipment
31 Equipment connector (second connector)
51 Relay connector
61 ECU-side harness connector (second connector)
100 Connector connection regeneration system
101 Regeneration circuit
101a Current transmission line
101b Return current grounding path
101b-1 Resistance element
101b-2 Ground
102 First connecting circuit
102a, 105a Three-contact relay for a forward path
102b, 105b Three-contact relay for a return path
103 First circuit for control
104 Ground circuit
105 Second connecting circuit
106 Second circuit for control
107 Controller
107a Detection unit
107b Trigger generation unit
107c Regeneration current source
107d Signal source
111a First signal terminal (first terminal)
111b First trigger terminal
112 Board connection terminal
113 Signal circuit
113a, 312a, 612a Signal forward path
113b, 312b, 612b Signal return path
211a First signal harness terminals
211b First trigger harness terminal
231a Second signal harness terminals
231b Second trigger harness terminal
311a, 611a Second signal terminal (second terminal)
311b, 611b Second trigger terminal
312, 612 Downstream circuit
511a First signal relay terminal
511b First trigger relay terminal
512a Second signal relay terminal
512b Second trigger relay terminal
513 Internal conductive line
CR11 Signal current
CR12 Regeneration current

What is claimed is:

1. A connector connection regenerating system for recovering a connected status between a first terminal of a first connector and a second terminal which is provided in a second connector and electrically connected to the first terminal, the connector connection regenerating system comprising:
   a regeneration circuit for conducting a regeneration current to the first terminal, the regeneration current being configured to remove a foreign material between respective terminal connecting sections of the first and second terminals;
   a first connecting circuit which connects the first terminal switchably to a signal circuit and to the regeneration circuit, the signal circuit being provided for conducting a signal current to the first terminal;
   a ground circuit for conducting to a predetermined ground the regeneration current which has flown to the second terminal via the first terminal;
   a second connecting circuit which connects the second terminal switchably to a predetermined downstream circuit and to the ground circuit; and
   a controller configured to control the first connecting circuit and the second connecting circuit upon a recovery instruction for the connected status so as to switch the first terminal from the signal circuit to the regeneration circuit and to switch the second terminal from the downstream circuit to the ground circuit,
   wherein the regeneration circuit and the first connecting circuit are integrated in the first connector together with the signal circuit and the ground circuit and the second connecting circuit are integrated in the second connector together with the downstream circuit.

2. The connector connection regenerating system according to claim 1,
   wherein a pair of first terminals and a pair of second terminals are provided for forward and return transfer for one signal current;
   wherein the ground is arranged in a location where the first connector is arranged;
   wherein the regeneration circuit is configured to input the regeneration current to one of the pair of first terminals and connect another of the pair of first terminals to the ground; and
   wherein the ground circuit is configured to short-circuit the pair of second terminals with each other in order to return the regeneration current which has flown to one of the second signal terminals via the one of the first signal terminals, to the another of the pair of first terminals via another of the second terminals, wherein the regeneration current then flows to the ground.

3. A connector connection regenerating system for recovering a connected status between a first terminal of a first connector and a second terminal which is provided in a second connector and electrically connected to the first terminal, the connector connection regenerating system comprising:
- a regeneration circuit for conducting a regeneration current to the first terminal, the regeneration current being configured to remove a foreign material between respective terminal connecting sections of the first and second terminals;
- a first connecting circuit which connects the first terminal switchably to a signal circuit and to the regeneration circuit, the signal circuit being provided for conducting a signal current to the first terminal;
- a ground circuit for conducting to a predetermined ground the regeneration current which has flown to the second terminal via the first terminal;
- a second connecting circuit which connects the second terminal switchably to a predetermined downstream circuit and to the ground circuit; and
- a controller configured to control the first connecting circuit and the second connecting circuit upon a recovery instruction for the connected status so as to switch the first terminal from the signal circuit to the regeneration circuit and to switch the second terminal from the downstream circuit to the ground circuit,
- wherein a pair of first terminals and a pair of second terminals are provided for forward and return transfer for one signal current;
- wherein the ground is arranged in a location where the first connector is arranged;
- wherein the regeneration circuit is configured to input the regeneration current to one of the pair of first terminals and connect another of the pair of first terminals to the ground; and
- wherein the ground circuit is configured to short-circuit the pair of second terminals with each other in order to return the regeneration current which has flown to one of the second signal terminals via the one of the first signal terminals, to the another of the pair of first terminals via another of the second terminals, wherein the regeneration current then flows to the ground.

4. A connector connection regenerating method for recovering a connected status between a first terminal of a first connector and a second terminal which is provided in a second connector and electrically connected to the first terminal, the connector connection regenerating method comprising:
- a first connecting step for switching the first terminal from a signal circuit to a regeneration circuit by a first connecting circuit upon receipt of a recovery instruction for the connected status, wherein the signal circuit is provided for conducting a signal current to the first terminal and the regeneration circuit is provided for conducting to the first terminal a regeneration current configured to remove a foreign material between respective terminal connecting sections of the first and second terminals;
- a second connecting step for switching the second terminal from a predetermined downstream circuit to a ground circuit by a second connecting circuit upon receipt of the recovery instruction for the connected status, wherein the ground circuit is provided for conducting to a predetermined ground the regeneration current which has arrived via the first terminal from a predetermined downstream circuit; and
- a regeneration step for applying the regeneration current to the regeneration circuit and conducting it from the first terminal to the ground via the ground circuit in order to remove the foreign material,
- wherein the regeneration circuit and the first connecting circuit are integrated in the first connector together with the signal circuit and the ground circuit and the second connecting circuit are integrated in the second connector together with the downstream circuit.

5. A connector connection regenerating method for recovering a connected status between a first terminal of a first connector and a second terminal which is provided in a second connector and electrically connected to the first terminal, the connector connection regenerating method comprising:
- a first connecting step for switching the first terminal from a signal circuit to a regeneration circuit upon receipt of a recovery instruction for the connected status, wherein the signal circuit is provided for conducting a signal current to the first terminal and the regeneration circuit is provided for conducting to the first terminal a regeneration current configured to remove a foreign material between respective terminal connecting sections of the first and second terminals;
- a second connecting step for switching the second terminal from a predetermined downstream circuit to a ground circuit upon receipt of the recovery instruction for the connected status, wherein the ground circuit is provided for conducting to a predetermined ground the regeneration current which has arrived via the first terminal from a predetermined downstream circuit; and
- a regeneration step for applying the regeneration current to the regeneration circuit and conducting it from the first terminal to the ground via the ground circuit in order to remove the foreign material,
- wherein a pair of first terminals and a pair of second terminals are provided for forward and return transfer for one signal current;
- wherein the ground is arranged in a location where the first connector is arranged;
- wherein the regeneration circuit is configured to input the regeneration current to one of the pair of first terminals and connect another of the pair of first terminals to the ground; and
- wherein the ground circuit is configured to short-circuit the pair of second terminals with each other in order to return the regeneration current which has flown to one of the second signal terminals via the one of the first signal terminals, to the another of the pair of first terminals via another of the second terminals, wherein the regeneration current then flows to the ground.

* * * * *